(12) United States Patent
Newman

(10) Patent No.: US 7,119,603 B2
(45) Date of Patent: Oct. 10, 2006

(54) STATIC, LOW-VOLTAGE FUSE-BASED CELL WITH HIGH-VOLTAGE PROGRAMMING

(75) Inventor: Paul F. Newman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/877,616

(22) Filed: Jun. 24, 2004

(65) Prior Publication Data

US 2005/0285663 A1 Dec. 29, 2005

(51) Int. Cl.
*H01H 37/76* (2006.01)
(52) U.S. Cl. .................... 327/525; 327/526; 365/225.7
(58) Field of Classification Search ................ 327/525, 327/526; 365/96, 225.7
See application file for complete search history.

(56) References Cited

U.S. PATENT DOCUMENTS

| | | | |
|---|---|---|---|
| 5,353,028 A * | 10/1994 | de Wit et al. ............... 341/172 |
| 5,731,733 A * | 3/1998 | Denham ...................... 327/525 |
| 5,959,445 A | 9/1999 | Denham | |
| 6,054,893 A | 4/2000 | Singh | |
| 6,346,738 B1 * | 2/2002 | Kim et al. .................. 257/529 |
| 6,417,720 B1 * | 7/2002 | Denham ...................... 327/525 |
| 6,498,526 B1 * | 12/2002 | Lim et al. .................... 327/525 |
| 6,654,304 B1 * | 11/2003 | Huang ...................... 365/225.7 |
| 6,885,604 B1 * | 4/2005 | Ott .......................... 365/225.7 |
| 2003/0141921 A1 | 7/2003 | Liu | |
| 2003/0218492 A1 | 11/2003 | Denham et al. | |

\* cited by examiner

*Primary Examiner*—Kenneth B. Wells
(74) *Attorney, Agent, or Firm*—Blakely, Sokoloff, Taylor & Zafman LLP

(57) ABSTRACT

A fuse-based cell is described. The fuse-based cell includes a fuse with a programming device coupled to the fuse to program the fuse. A sense device is coupled to the fuse to sense a programming state of the fuse. A pass device is coupled to the sense device to control voltages across the sense device during sensing. A switch is coupled to the sense device and a load is coupled to the switch. The switch isolates the load and the sense device from high voltage during a programming event. The load sets a read current used to read the state of the fuse.

6 Claims, 5 Drawing Sheets

STATIC, LOW-VOLTAGE FUSE-BASED CELL WITH HIGH-VOLTAGE PROGRAMMING

TECHNICAL FIELD

Embodiments of the present invention relate to fuse-based cells and, more particularly, to fuse-based cells programmable with high voltages.

BACKGROUND

In integrated circuit devices, it is often desirable to be able to permanently store information, or to form permanent connections on the integrated circuit after it is manufactured. Fuses or other devices forming fusible links are frequently used for this purpose. A fused based cell can permanently store data, for example, where a burned fuse represents a "1" and an unburned fuse represents a "0." Similarly, fuses can form permanent connections on integrated circuits after they are manufactured. Where fuses are used for information storage purposes, a sensing circuit is typically used to determine the state of a fuse (whether the fuse has been programmed or not). The sensing circuit is used to determine the value that is stored. Sensing circuits operate to distinguish between programmed and unprogrammed (or burned and unburned) fuses, usually by detecting a change in the resistance of the fuse device from a low to a high value.

Advances in semiconductor manufacturing technology have decreased the resistance of fuses after they have been burned, referred to as post-burn resistance. Similarly, the operating voltages of most semiconductor devices have been reduced in pursuit of lower power consumption. While higher burning voltages move the post-burn resistance to a high level, the higher voltages may damage semiconductor devices designed to operate at lower voltages. It would be useful to have the ability to use higher burning voltages for fuse-based devices, while providing protection for devices that operate at lower voltages.

As semiconductor manufacturing processes move to lower supply voltages, the voltage available to program fuses is decreased. As the fuse programming voltage is lowered, the number of "marginally burned" fuses increases. Fuses are considered to be marginally burned when, after programming, the resistance of the fuse remains low enough that there is an unacceptable risk that the fuse might be identified as being unprogrammed when its state is sensed. Therefore, marginally burned fuses may compromise the functionality of quality of circuit that uses the fuse. This is particularly true where the state of the single fuse determines that state of a fuse based storage cell. Additional or redundant fuses have previously been provided for this type of cell, but each redundant fuse takes up valuable space.

Some fuse based cells are designed to be programmed using a higher programming voltage than the core supply voltage used in the normal system operation. The use of a higher programming voltage enables reliable programming of fuses by insuring that the number of marginally burned fuses is minimized. One such fuse based cell uses vertical diffusion metal oxide semiconductor (VDMOS) transistors to protect the other transistors in the cell from damage during programming events during which the programming voltage is raised substantially above the supply voltage. The VDMOS transistors can withstand higher voltages without degradation than the non-VDMOS transistors. While the VDMOS transistors are able to withstand high voltages, they unfortunately have higher output resistance than regular transistors. In addition, compared with regular complimentary metal oxide semiconductor (CMOS) transistors, VDMOS transistors tend to exhibit more variation in their characteristics because they are an auxiliary device and are not the focus of the same kinds of process developments as seen with process developments for CPU performance.

BRIEF DESCRIPTION OF THE DRAWINGS

Embodiments of the present invention are illustrated by way of example and not intended to be limited by the figures of the accompanying drawings.

DETAILED DESCRIPTION

In the following description, numerous specific details are set forth such as examples of specific systems, techniques, components, etc. in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention. A "line" discussed herein that connect components may be a single bit line, multiple bit lines, or buses. The term "coupled" as used herein means coupled directly to, or indirectly through one or more intervening components.

A fuse-based cell is described. The fuse-based cell includes a fuse with a programming device coupled to the fuse to program the fuse. A sense device is coupled to the fuse to sense a programming state of the fuse. A pass device is coupled to the sense device to control voltages across the sense device during sensing. A switch is coupled to the sense device and a load is coupled to the switch. The switch isolates the load and the sense device from high voltage during a programming event. The load sets a read current used to read the state of the fuse. In one embodiment, the load may include non-high voltage devices and the switch may include high voltage devices such as VDMOS transistors. In one particular embodiment, VDNMOS transistors may be used.

Figure 1:
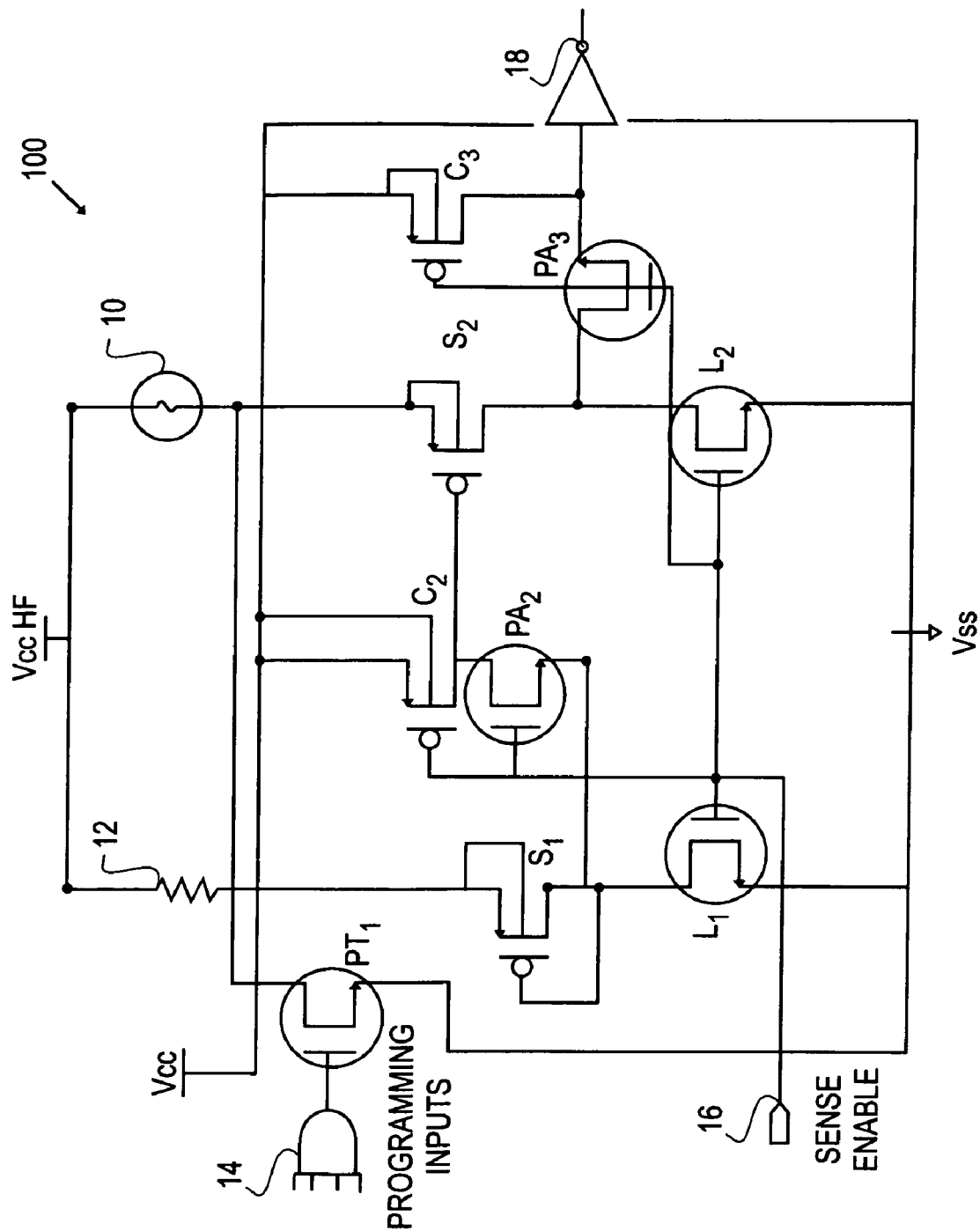
FIG. 1 illustrates a conventional high-voltage programming circuit for a fuse-based cell.

FIG. 1 illustrates a conventional high-voltage programming circuit for a fuse-based cell, as discussed in U.S. patent application 2003/0218492, published Nov. 27, 2003. The fused based cell 100 of FIG. 1 is a single-ended, or 'non-differential' fuse-based circuit. This cell 100 uses n-type VDMOS (VDNMOS) devices, designated by a circle, for programming and protection of the non-high-voltage devices. These high-voltage devices are also asymmetric, in that their sources and drains cannot be reversed. Because of the high-voltage devices, the cell 100 has two levels of voltage supplied to it: a core supply voltage (Vcc) and a higher programming voltage (VccHF). The VDNMOS devices are programming transistor PT1, load transistors L1 and L2, and pass transistors PA2 and PA3. Sense transistors S1, S2 and clamping transistors C2 and C3 are not high voltage devices and may require protection from a high programming voltage.

The operation of the cell 100 may be described in terms of one of three phases: a pre-programming phase; a programming phase; and a sensing phase. In the pre-programming phase, for example, the voltage supply Vcc is at a nominal voltage, such as 1.3 volts. The programming voltage supply VccHF is at a higher voltage, for example, approximately two times Vcc, in this case 2.6 volts. The load transistors L1 and L2 are matched high-voltage devices that can handle double the usual voltage, hence the doubling of Vcc to reach the value for VccHF. The provided voltages are only exemplary and other voltages may be used.

In the pre-programming phase, the pass transistors PA2 and PA3 are off. The programming circuit and transistor PT1 drift up to VccHF. PT1 is also off, and its drain drifts up to VccHF. The pass transistors guarantee that the gate voltage of the clamp and sense transistors is at a neutral voltage and the bulk, source and drain are allowed to drift to VccHF. This does not damage these transistors, as the gate voltage is clamped to a safe voltage of Vcc, thereby protecting the sense and clamp transistors from the high voltage.

In the non-sensing phases of programming and pre-programming, clamp transistor C3 clamps the gate of the output driver to a predictable, known value when not sensing. This ensures that there is no additional leakage current.

In the programming phase, the AND gate inputs 14 are manipulated such that PT1 turns on, pulling the negative terminal of the fuse 10 to ground, which causes the fuse 10 to be burned. At the end of the burning event, the negative terminal of the fuse 10 is at or near Vss, for example, ground. Subsequently, the source of the sensing transistor S2 will also be at or near Vss. Additionally, the bulk of S2, electrically coupled to its source, is also pulled to a voltage at or near Vss.

During programming, clamping device C2 pulls the gate of S2 to nominal Vcc, the gate to drain and gate to source voltages are held to safe levels. Tying the bulk terminal of S2 to the source additionally guarantees that the device voltages stay within safe limits. As the source of S2 goes towards Vss, the gate is clamped to ground by clamping device C2 and the voltage across the device will never exceed 1.3 volts, or the value of Vcc. Similar precautions are taken with sense device S1 to protect it from the high voltages.

In the sensing phase, VccHF and Vcc are set to the same voltage. This will typically equal the Vcc voltage used in the pre-programming and programming phases, but may vary as needed. The sense enable signal 16 is high, which turns on load devices L1 and L2. The pass transistors PA2 and PA3 turn on. This causes the output of PA3, pulled high by L2 to be clamped to Vcc and produce a voltage in the appropriate range for a logical 1, with a logical 1 being produced if the fuse if burned, and a logical 0 being produced if it is not burned.

Figure 2:
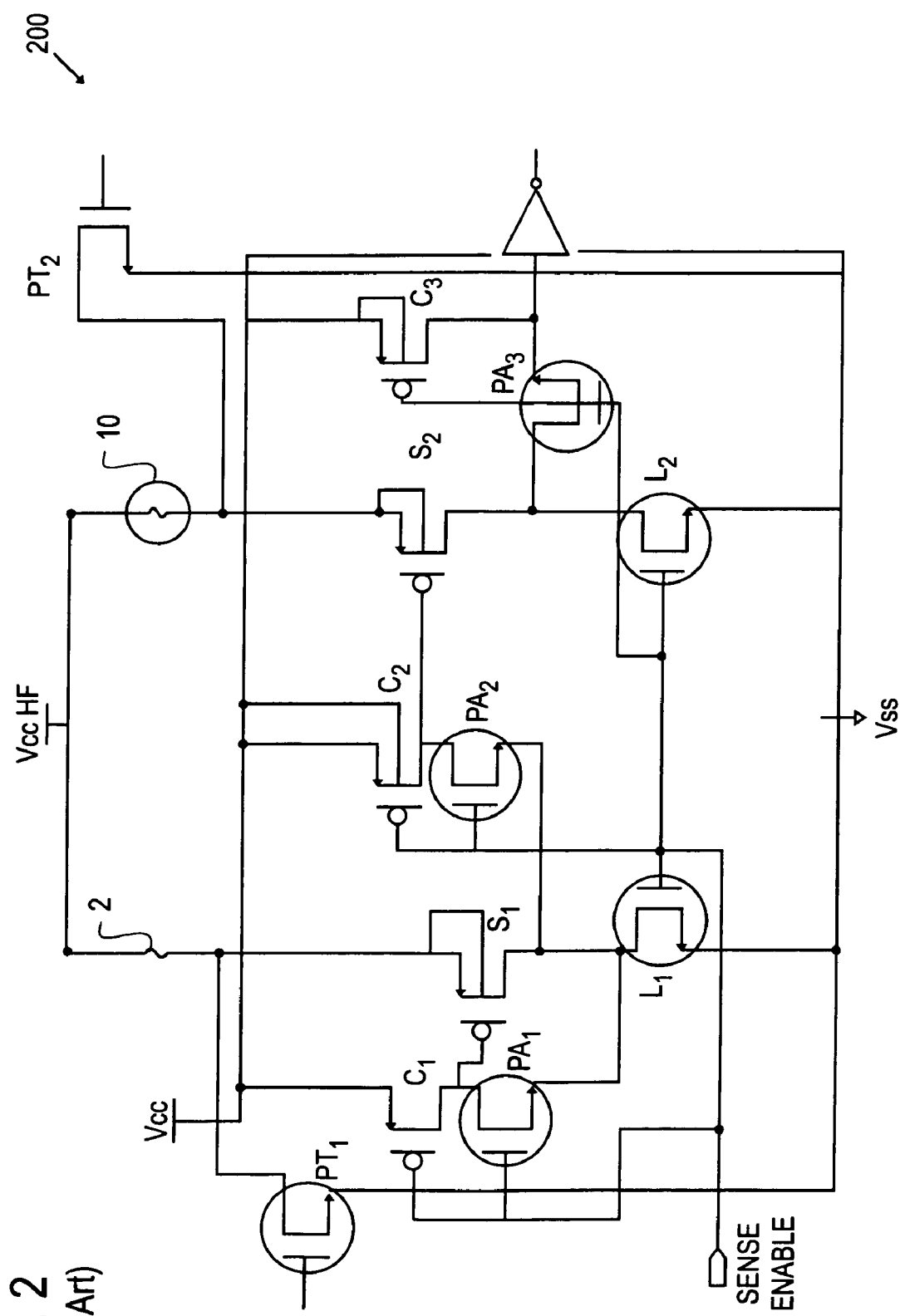
FIG. 2 illustrates a conventional differential high-voltage programming circuit for a fuse-based cell.

FIG. 2 illustrates a conventional differential fuse-based cell, as discussed in U.S. patent application 2003/0218492. Cell 200 is similar to that shown in FIG. 1, but also includes the high-voltage VDNMOS devices for the programming transistors PT1 and PT2, the pass transistors PA1, PA2 and PA3 and the load transistors L1 and L2. These devices operate to protect the non-high-voltage devices from the high programming voltages.

In cell 100 of FIG. 1, the protection circuit of PA3 and C3 was necessary to protect the sensing transistor S2. The reference resistor 2 in cell 100 does not have its negative terminal pulled toward Vss. Therefore no protection circuit is necessary. However, in cell 200 of FIG. 2, the reference fuse 12 has its negative terminal pulled towards Vss and, therefore, the protection circuit of PA1 and C1 may be used. In addition, a second programming transistor PT2 is necessary to control programming of the clear, or reference, fuse 12.

Figure 3:
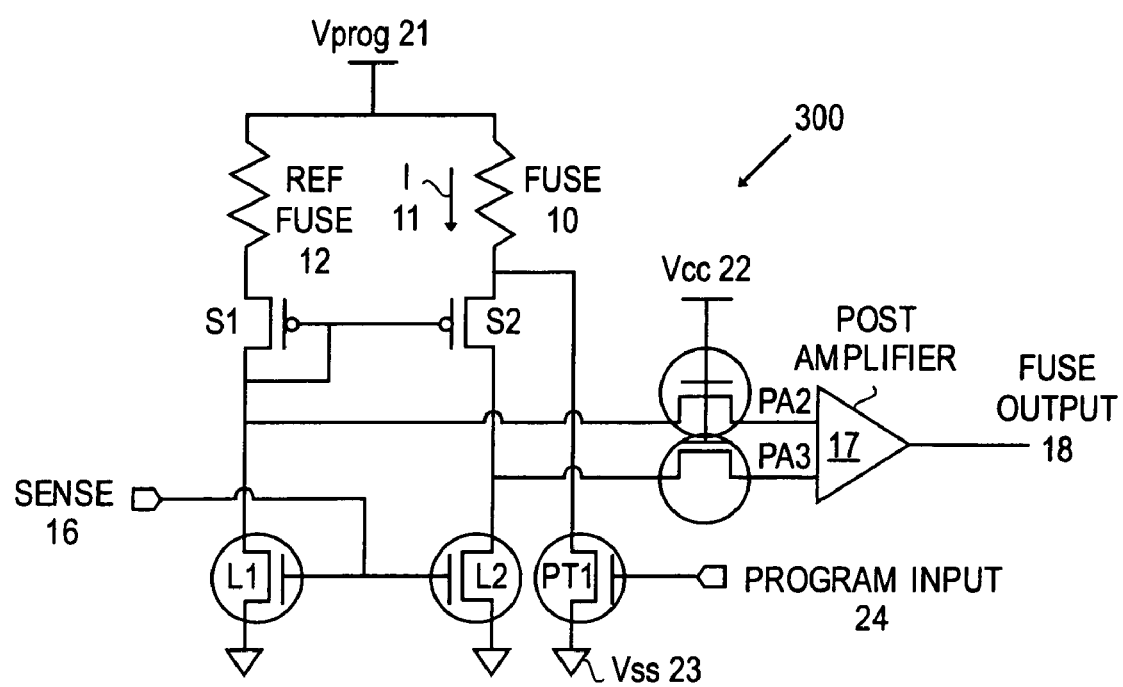
FIG. 3 illustrates a simplified schematic of the fused based cell of FIG. 1.

The protection from the high voltages used in programming fuses 10 and 12 comes from these high-voltage devices (e.g., VDNMOS transistors) configured to block the non-high voltage devices. FIG. 3 illustrates a simplified schematic of the fused based cell 100 of FIG. 1. Certain components of cell 100 have been omitted from FIG. 3 (e.g., the clamp transistors) for clarity in understanding embodiments of the invention discussed below.

As previously mentioned, VDNMOS transistors can withstand higher voltages without degradation than the non-VDNMOS transistors. In particular, the VDNMOS transistors can protect other transistors from damage during programming events during which the programming voltage (Vprog in FIG. 3 or VccHF in FIG. 1) is raised substantially above the core supply voltage Vcc. Vprog provides the high voltage that enables reliable programming of the fuse 10. In one embodiment, during a read of the fuse cell, Vprog may be set equal to a lower value of Vcc. In cell 300 of FIG. 3, transistors L1 and L2 protect sense transistors S1 and S2 from damage during a programming event. Transistors L1 and L2 also act as loads during a read operation, providing bias current. While the VDNMOS transistors L1 and L2 are able to withstand high voltages, VDNMOS transistors L1 and L2, unfortunately, have higher output conductance than the other types of transistors. For example, compared with CMOS transistors, VDNMOS transistors tend to exhibit more variation in their characteristics. An improved fused base cell is discussed below in relation to FIG. 4.

Figure 4:
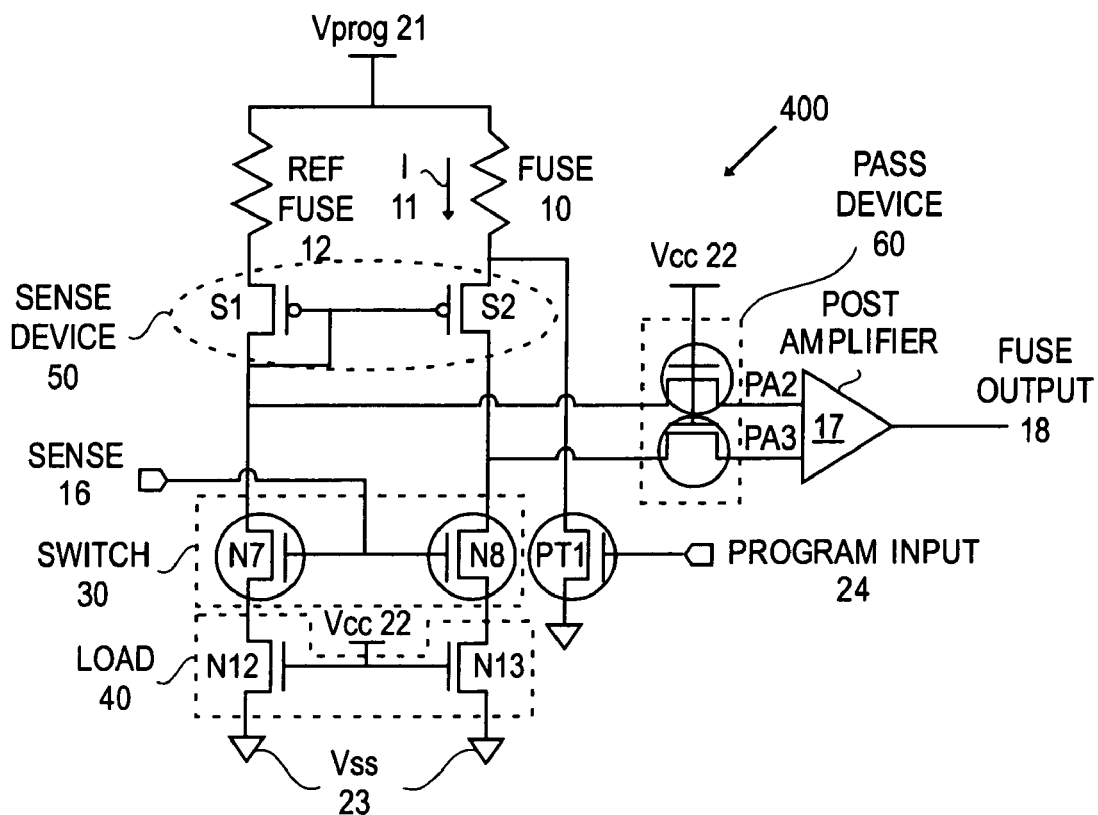
FIG. 4 illustrates one embodiment of a high-voltage programming circuit for a fuse-based cell.

FIG. 4 illustrates one embodiment of a high-voltage programming circuit for a fuse-based cell. Although fused based cell 400 is described in this embodiment using VDNMOS transistors, alternatively other devices may be used that allow higher than nominal voltage, for example, a CMOS transistor having a thick gate oxide. It should also be noted again that certain well known fused based cell components have been omitted from FIG. 4 for clarity. In alternative embodiments, cell 400 may include such additional components, for one example, clamp transistors to clamp the gate of the output driver to a predictable, known value when not sensing in order to ensure that there is no additional leakage current.

Similar to the operation discussed above with respect to cell 100 of FIG. 1, in the pre-programming phase, the pass device 60 (e.g., transistors PA2 and PA3) of cell 400 is off. Transistor PT1 is off and the program input 24 along with the drain of transistor PT1 drift up to Vprog 21. The pass transistors PA2 and PA3 guarantee that the gate voltage of the sense transistors S1 and S2 is at a neutral voltage and the bulk, source and drain are allowed to drift to Vprog 21. In one embodiment, as previously mentioned, the gate voltage may be clamped to the safe voltage of Vcc 22 using clamp transistors, thereby protecting the sense and clamp transistors from the high voltage of Vprog 21.

In the programming phase, the program input 24 is manipulated such that PT1 turns on, pulling the negative terminal of the fuse 10 to Vss 23 (e.g., ground), which causes the fuse 10 to be burned. At the end of the burning event, the negative terminal of the fuse 10 is at or near Vss 23. Subsequently, the source of the sensing transistor S2 will also be at or near Vss 23.

In the sensing phase, Vprog 21 and Vcc 22 are set to the same voltage. This will typically equal the Vcc 22 voltage used in the pre-programming and programming phases, but may vary as needed. In the embodiment illustrated in FIG. 4, two NMOS transistors, N12 and N13 are coupled between transistors N7 and N8, and Vss 23 (e.g., ground). VDNMOS transistors N7 and N8 operate as a switch 30 that isolate sense device 50 (e.g., transistors S1, S2) and load 40 (e.g., transistors N12, N13) from exposure to the full potential difference between the high voltage of Vprog 21 and Vss 23 during a programming event. When the sense enable signal 16 is high, switch 30 (e.g., transistors N7 and N8), and consequently, load 40 (e.g., transistors N12 and N13), are turned on. The pass device 60 (e.g., transistors PA2 and PA3) also turns on. This causes the output of PA3, pulled high by N12, N7 to be clamped to Vcc 22 and produce a voltage (amplified by post amplifier 17) on fuse output 18 in the appropriate range for a logical 1, with a logical 1 being produced if the fuse 10 is burned, and a logical 0 being produced if fuse 10 is not burned. Alternatively, switch 30, load 40 and/or pass device 60 may be formed using other numbers of transistors and other types of components (e.g., switching diodes) than shown in FIG. 4.

In one embodiment, to provide a small resistance and low voltage drop when VDNMOS transistors N7 and N8 are turned on, the VDNMOS transistors N7 and N8 may be increased in size from that of transistors L1 and L2 of FIG. 3. Transistors N12 and N13 set the read current and are sized appropriately for correct functioning of the fuse based cell 400, as is known in the art. In cell 300 of FIG. 3, the read current (I) 11 is directly dependent upon the strength of transistors L1 and L2. In cell 400 of FIG. 4, the value of the read current 11 is only weakly influenced by the strength of transistors N7 and N8.

An additional benefit of the cell 400 is that the output impedance of the NMOS transistors N12 and N13 is higher than the output impedance of transistors L1 and L2 in cell 300 of FIG. 3. As a consequence, the cell 400 may have a higher gain and less systematic offset in the cell trip point than cell 300.

The use of a mix of high-voltage transistors and nominal-voltage transistors illustrated in FIG. 4 allows for higher post-burn resistance in fuse 10 due to the high-voltage burning of the fuse, while also providing lower power consumption. The combination of high and nominal voltage devices provides high sensitivity and lower power consumption than using all high-voltage devices. Alternatively, one or more of the nominal voltage transistors of FIG. 4 may be replaced with high-voltage transistors. Furthermore, in another embodiment, the n-channel devices may be replaced by p-channel devices and vice versa. Cell 400 may be configured as a differential fused based cell, as discussed below in relation to FIG. 5.

Figure 5:
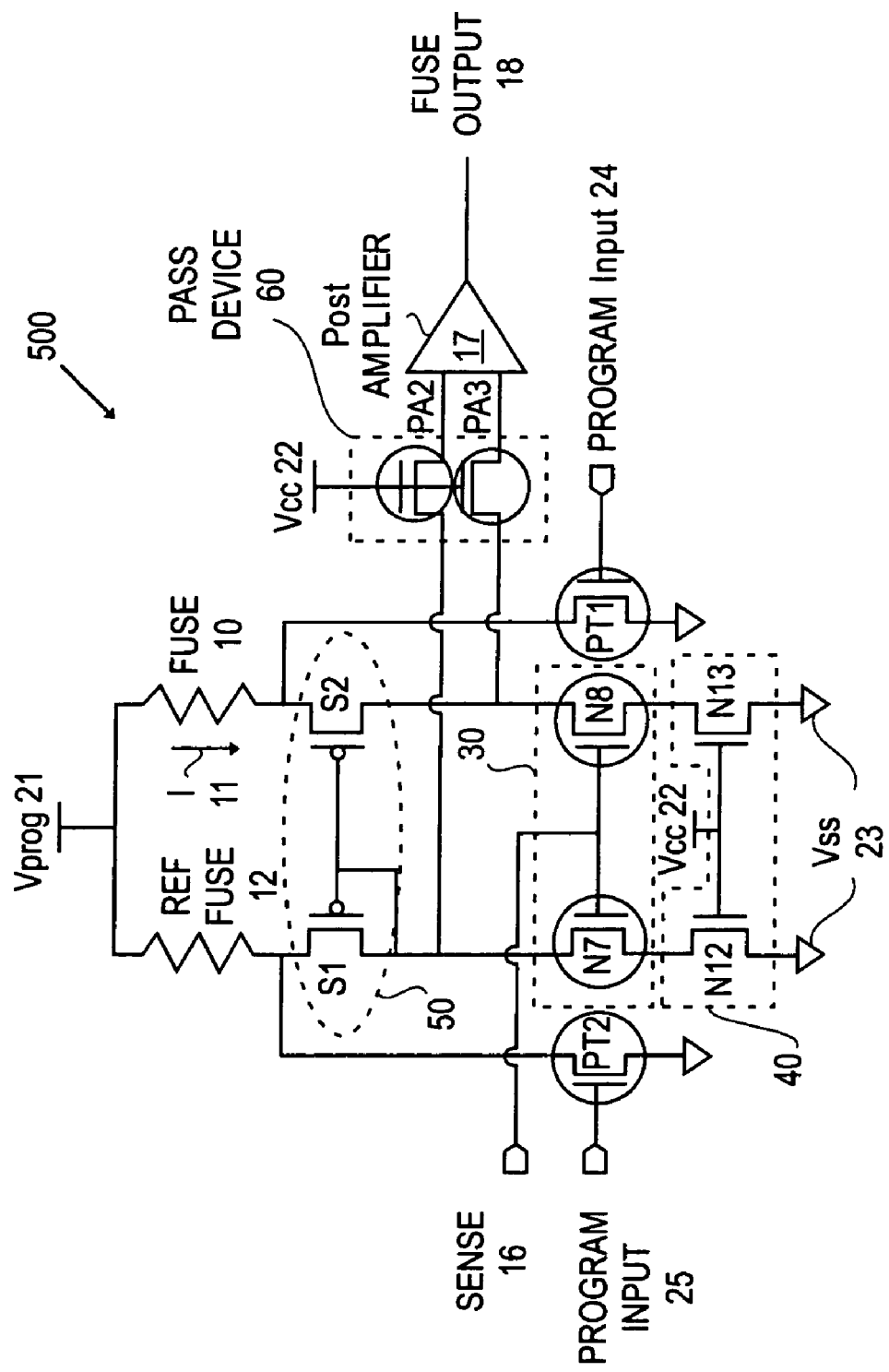
FIG. 5 illustrates one embodiment of a high-voltage programming circuit for a differential fuse-based cell.

FIG. 5 illustrates one embodiment of a high-voltage programming circuit for a differential fuse-based cell. Cell 500 is similar to that shown in FIG. 4, but also includes a high-voltage VDNMOS device for the programming transistors PT2 to control the programming of fuse 12. In cell 500 of FIG. 5, the reference fuse 12 will also have its negative terminal pulled toward Vss 23 and, therefore, a protection circuit similar to that illustrated in FIG. 2 may be used for reference fuse 12 as well as a protection circuit for fuse 10. The use of such protection circuits is known in the art and has been omitted from FIG. 5 for clarity.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A fuse-based cell, comprising:
   a fuse;
   a programming device coupled to the fuse to program the fuse;
   a sense device coupled to the fuse to sense a programming state of the fuse;
   a switch coupled to the sense device;
   a load coupled to the switch; and
   a pass device coupled to the sense device to control voltages across the sense device during sensing, wherein the switch comprises high voltage devices, and wherein the load comprises non-high voltage devices.

2. A fuse-based cell, comprising:
   a fuse;
   a programming device coupled to the fuse to program the fuse;
   a sense device coupled to the fuse to sense a programming state of the fuse;
   a switch coupled to the sense device, wherein the switch comprises:
      a first VDNMOS transistor and a second VDNMOS transistor;
   a load coupled to the switch;
   a pass device coupled to the sense device to control voltages across the sense device during sensing, wherein the load comprises:
   a first NMOS transistor coupled to the first VDNMOS transistor; and
   a second NMOS transistor coupled to the second VDNMOS transistor, wherein each of the first and second NMOS transistors has a gate that is coupled to each other and to a supply voltage.

3. The fuse-based cell of claim 2, wherein the first and second NMOS transistors are coupled between the first and second VDNMOS transistors and a ground, respectively.

4. The fuse-based cell of claim 3, wherein the first and second VDNMOS transistors are larger than the first and second NMOS transistors.

5. The fuse-based cell of claim 2, wherein the pass device comprises a third VDNMOS transistor and a fourth VDNMOS transistor, each of the third and fourth VDNMOS transistors having a gate coupled to each other and to the supply voltage.

6. An apparatus, comprising:
   a supply voltage;
   means for programming a fuse with a programming voltage being greater than the supply voltage;
   means for sensing a programmed state of the fuse;
   means for providing bias current to the means for sensing; and
   means for isolating the means for sensing, from exposure to a full potential difference between the simply voltage and the programming voltage during programming, wherein the means for isolating is separate from the means for providing bias current, wherein the means for isolating further comprises means for isolating the means for providing bias current from the programming voltage, and wherein the means for isolating comprises means for increasing a gain of the cell.

* * * * *

UNITED STATES PATENT AND TRADEMARK OFFICE
CERTIFICATE OF CORRECTION

| | | |
|---|---|---|
| PATENT NO. | : 7,119,603 B2 | Page 1 of 1 |
| APPLICATION NO. | : 10/877616 | |
| DATED | : October 10, 2006 | |
| INVENTOR(S) | : Newman | |

It is certified that error appears in the above-identified patent and that said Letters Patent is hereby corrected as shown below:

In column 6, at line 58, after "the" delete "simply" insert --supply--.

Signed and Sealed this

Tenth Day of April, 2007

JON W. DUDAS
*Director of the United States Patent and Trademark Office*